US006601230B2

(12) United States Patent
Srikantam

(10) Patent No.: US 6,601,230 B2
(45) Date of Patent: Jul. 29, 2003

(54) LOW POWER CIRCUIT DESIGN THROUGH JUDICIOUS MODULE SELECTION

(75) Inventor: Vamsi K. Srikantam, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 90 days.

(21) Appl. No.: 09/828,321

(22) Filed: Apr. 5, 2001

(65) Prior Publication Data

US 2002/0147959 A1 Oct. 10, 2002

(51) Int. Cl.[7] ............................................... G06F 17/50
(52) U.S. Cl. ................... 716/18; 716/2; 716/4; 703/22
(58) Field of Search .................. 716/2, 4, 3, 18–21; 703/13, 22, 1, 18

(56) References Cited

U.S. PATENT DOCUMENTS 5,912,819 A * 6/1999 Kucukcakar et al. .......... 716/19
5,995,736 A * 11/1999 Aleksic et al. ................ 716/18
6,298,472 B1 * 10/2001 Phillips et al. ................ 716/18

* cited by examiner

Primary Examiner—Minh Nguyen

(57) ABSTRACT

A circuit design system that obtains low power circuit design through judicious module selection. The circuit design system implements methods that enable advantageous design tradeoffs between low power behavior and a set of design constraints during module selection. The circuit design system selects unsigned modules which consume less power than signed modules where permitted in view of a desired response of a circuit and where advantageous for low power behavior while not violating the design constraints.

19 Claims, 4 Drawing Sheets

LOW POWER CIRCUIT DESIGN THROUGH
JUDICIOUS MODULE SELECTION

BACKGROUND OF THE INVENTION

1. Field of Invention

The present invention pertains to the field of circuit design. More particularly, this invention relates to low power circuit design through judicious module selection.

2. Art Background

Electronic circuits including integrated circuits such as application-specific integrated circuits (ASICS) may be employed in a wide variety of applications. The design process for relatively complex electronic circuits typically includes the generation of a behavioral specification of a circuit under design, the generation of a register transfer level (RTL) description from the behavioral description, and then the synthesis of a gate-level description from the RTL description.

A behavioral description usually characterizes a circuit under design as an arrangement of subsystems that perform desired functions. An RTL description usually specifies particular operations, such as add, multiply, shift, etc., that are to be performed during clock cycles of the circuit under design. A gate-level description usually provides the information necessary for fabrication of the circuit under design.

The process of generating an RTL description from a behavioral description usually includes the step of scheduling the operations that are to be performed during each clock cycle. A variety of modules are usually available for performing a scheduled operation. Therefore, the process of generating an RTL description from a behavioral description also usually includes the step of selecting which modules from the available modules are to be used perform the scheduled operations. Typically, the available modules differ according to one or more parameters.

Consider a design example in which a multiplication operation is scheduled for cycle n. One of a variety of available multiplier modules may be selected for use during cycle n according to the desired response. For example, the available multiplier modules may differ according to parameters such as resolution, rounding behavior, signed/unsigned operations, number of gates, etc.

Prior circuit design methods usually select modules in view of a set of design constraints. Such design constraints typically include a constraint on the overall gate count for the circuit under design and a constraint on the clock speed of the circuit under design. Unfortunately, prior techniques for circuit design usually do not provide a methodology for achieving low power consumption that enables tradeoffs between low power consumption and design constraints on the use of signed and unsigned modules together.

SUMMARY OF THE INVENTION

A circuit design system is disclosed that obtains low power circuit design through judicious module selection. The circuit design system implements methods that enable advantageous design tradeoffs between low power behavior and design constraints during module selection. The circuit design system selects unsigned modules which consume less power than signed modules where permitted in view of a desired response of a circuit and where advantageous for low power behavior while not violating the design constraints.

In one embodiment, the circuit design system selects an unsigned module for performing a scheduled operation in a circuit if permissible in view of a desired response of the circuit. If an existing signed module is appropriate for the scheduled operation, then the circuit design system selects an unsigned module for performing the scheduled operation if permissible in view of the desired response and if the unsigned module does not violate a set of design constraints for the circuit and uses the existing signed module otherwise. Otherwise, the circuit design system selects a signed module for performing the scheduled operation.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
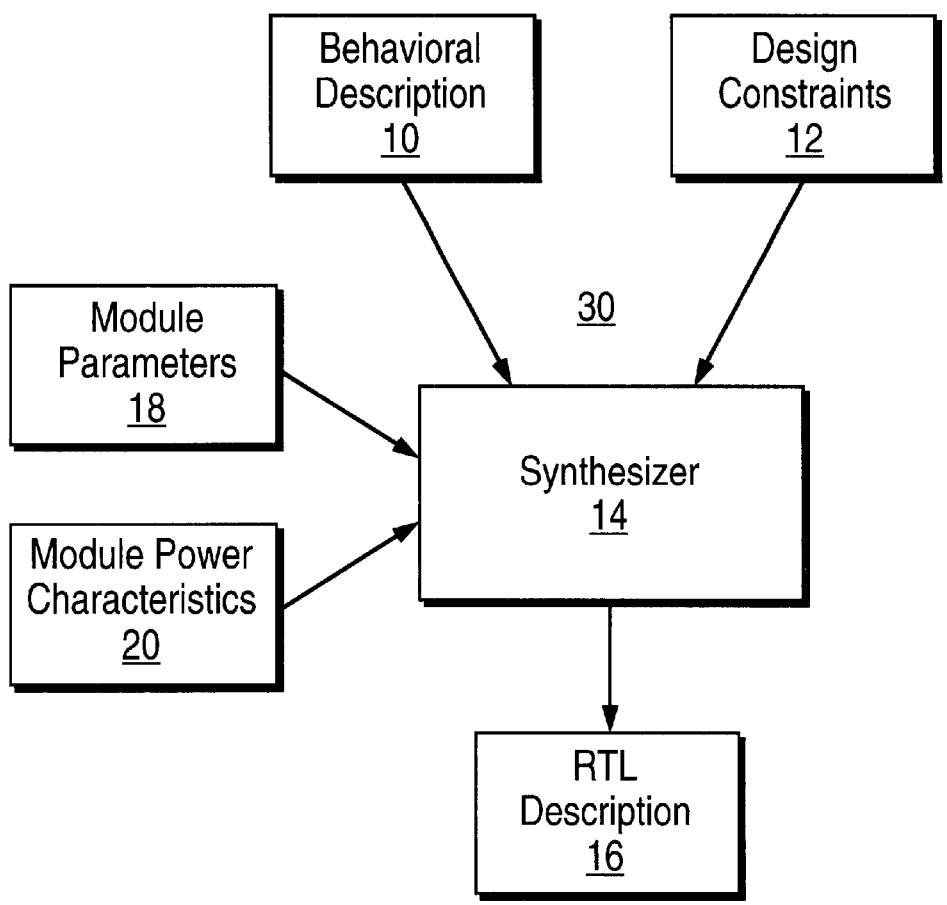
FIG. 1 shows a circuit design system according to the present techniques.

FIG. 1 shows a circuit design system 30 according to the present techniques. The circuit design system 30 includes a synthesizer 14 that generates an RTL description 16 in response to a behavioral description 10 and a set of design constraints 12. The synthesizer 14 uses a set of module parameters 18 and a set of module power characteristics 20 when selecting modules for the RTL description 16.

The behavioral description 10 provides a behavioral level specification of the functionality of a circuit under design. In one embodiment, the behavioral description 10 characterizes the circuit under design as an arrangement of subsystems that perform a set of desired functions which provide a desired response.

The design constraints 12 specify a set of constraints on one or more characteristics of the circuit under design. In one embodiment, the design constraints 12 include a limit on the number of gates, i.e. the overall gate count, in the circuit under design and a constraint on the clock speed or delay of the circuit under design.

The module parameters 18 provide a set of parameters for each of a set of available modules that may be employed in the circuit under design. In one embodiment, the parameters for an available module include the number of gates consumed by the module and a delay associated with the module. For an available module that performs mathematical (math) functions, the parameters include indications of whether the available module performs signed or unsigned arithmetic, as well as rounding behavior, bit width, etc.

The module power characteristics 20 specify the power characteristics of each of the available modules including power consumption. In one embodiment, the power characteristics for an available module include its power consumption in response to a variety of input vectors so that modules may be selected based upon input vectors that may be applied.

The circuit design system 30 in one embodiment is implemented in software that executes on a computer system. For example, the synthesizer 14 may be implemented as an application program that reads files containing the behavioral description 10 and the design constraints 12 and that writes the RTL description 16 to a file. A wide variety of computer systems may be used including personal computers, engineering workstations, mainframe systems, etc. Alternatively, the synthesizer 14 may be implemented in hardware or a combination of processing hardware and code.

Figure 2:
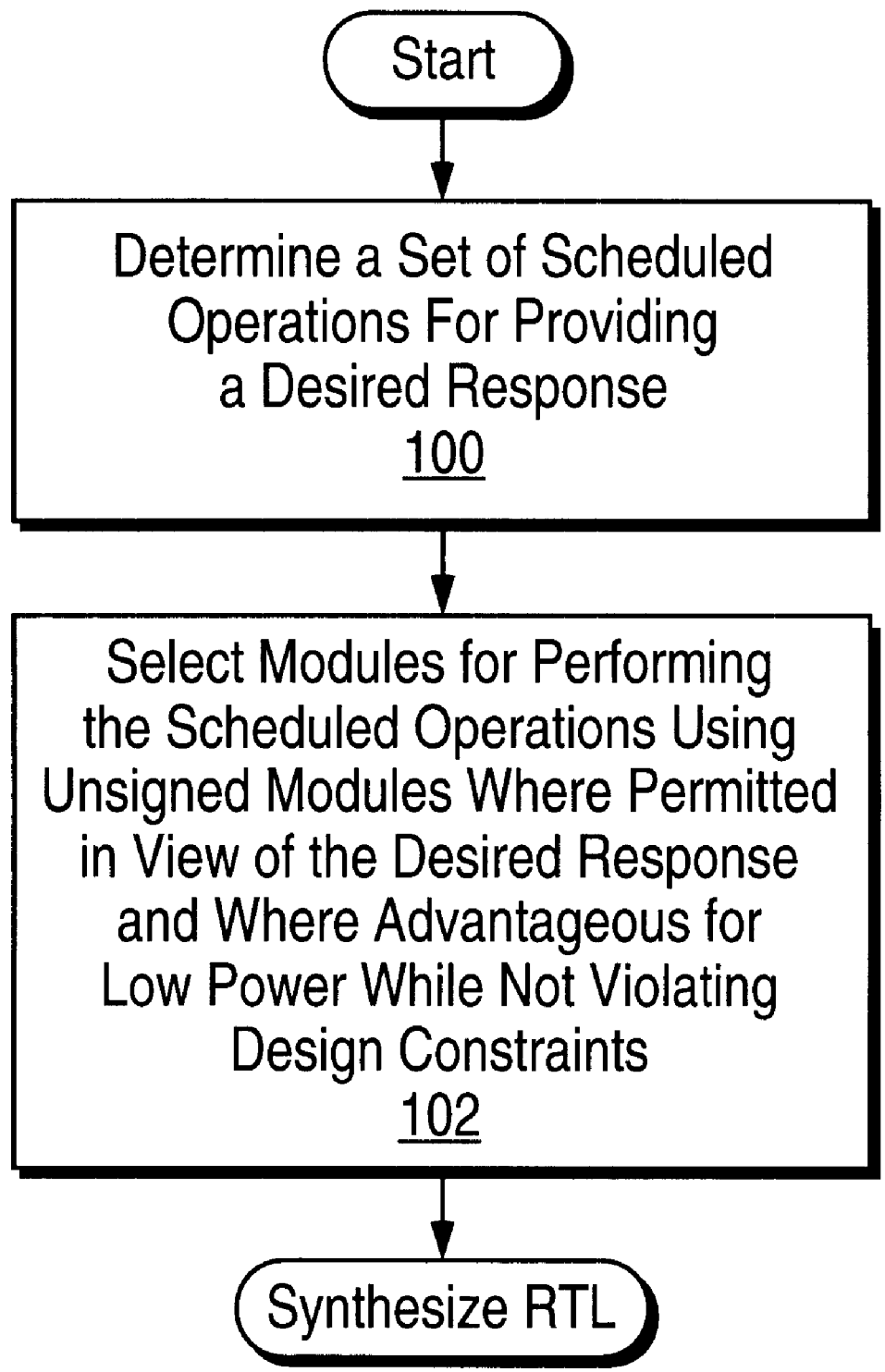
FIG. 2 shows a method for low power circuit design through judicious module selection according to the present techniques.

FIG. 2 shows a method for low power circuit design through judicious module selection according to the present techniques. In one embodiment, the method steps shown are performed by the synthesizer 14 when generating the RTL description 16.

At step 100, the synthesizer 14 performs scheduling of operations that provide the desired response of the circuit under design. Examples of operations that may be scheduled include math operations such as add, multiply, shift, etc. as well as a variety of other digital and/or analog operations.

The operations scheduled at step 100 are assigned to be performed during particular clock cycles of the circuit under design and the assignment of operations to particular clock cycles depends on the desired response of the circuit under design. The operations scheduled at step 100 may be referred to as scheduled operations.

At step 102, the synthesizer 14 selects a set of modules for performing the scheduled operations. The modules selected at step 102 are to be synthesized into the RTL description 16 and implemented in the circuit under design. The synthesizer 14 selects modules from among the available modules at step 102 such that unsigned modules are used where permitted in view of the desired response and where advantageous in a tradeoff between the design constraints 12 and low power behavior.

Figure 3:
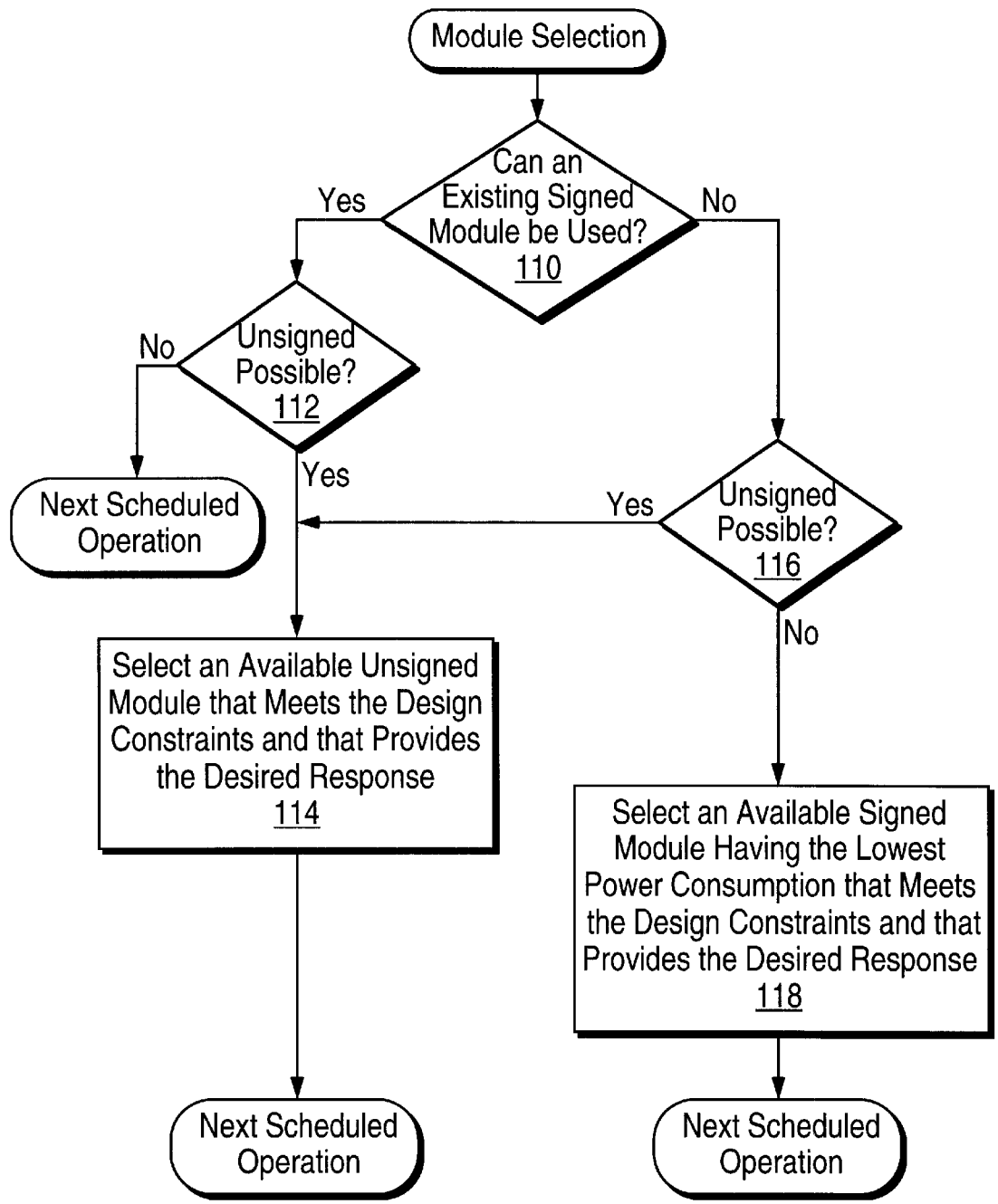
FIG. 3 illustrates the module selection performed at step 102 in one embodiment.

FIG. 3 illustrates the module selection performed at step 102 in one embodiment. The method steps shown may be performed for each of the scheduled operations obtained at step 100.

At step 110, the synthesizer 14 determines whether an existing signed module can be used to perform a scheduled operation. For example, if the scheduled operation is a 16-bit signed multiply operation or a 16-bit unsigned multiply operation and a signed multiplier of 16-bits or higher has previously been selected for a previous scheduled operation then that existing signed multiplier can be used at step 110.

If an existing signed module can be used at step 110 then at step 112 the synthesizer 14 determines whether it is possible to use an unsigned module to perform the scheduled operation. For example, if the scheduled operation is a 16-bit unsigned multiply operation then it is possible to use an unsigned module at step 112 even though this would add an additional module given that an existing module could be used for the scheduled operation.

If it is not possible to use an unsigned module at step 112, then the existing signed module will be used for the scheduled operation and the synthesizer 14 moves on to perform module selection for the next scheduled operation.

If it is possible to use an unsigned module at step 112, then at step 114 the synthesizer 14 uses the module parameters 18 to select an unsigned module from among the available modules that provides the desired response and that meets the design constraints 12. For example, if the scheduled operation is a 16-bit add then a 16-bit unsigned adder would provide the desired response specified in the behavioral description 10. A 16-bit adder selected at step 14 must have the speed required by the design constraints 12 and must not cause the overall gate count of the circuit under design to exceed the limit specified in the design constraints 12. If a suitable unsigned module is not available then the existing signed module is used and the synthesizer 14 moves on to perform module selection for the next scheduled operation. The synthesizer 14 may also use the module power characteristics 20 to select a suitable unsigned module having the lowest power consumption at step 114.

The steps 110–114 enable a trade-off between power savings and the design constraints 12. The selection of an additional unsigned module at step 114 yields power savings because the additional unsigned module consumes less power than the existing signed module. The trade-off is additional gates for the circuit under design but the overall design is still within the constraints on the overall gate count.

If an existing signed module cannot be used at step 110 then at step 116 the synthesizer 14 determines whether it is possible to use an unsigned module to perform the scheduled operation according to the desired response. If it is not possible to use an unsigned module at step 116, then at step 118 the synthesizer 14 uses the module parameters 18 and 20 to select a signed module from among the available modules that provides the desired response and that meets the design constraints 12 and that has the lowest power consumption. Otherwise, at step 114 the synthesizer 14 selects an unsigned module from among the available modules that provides the desired response and that meets the design constraints 12. The synthesizer 14 then performs module selection for the next scheduled operation.

Figure 4:
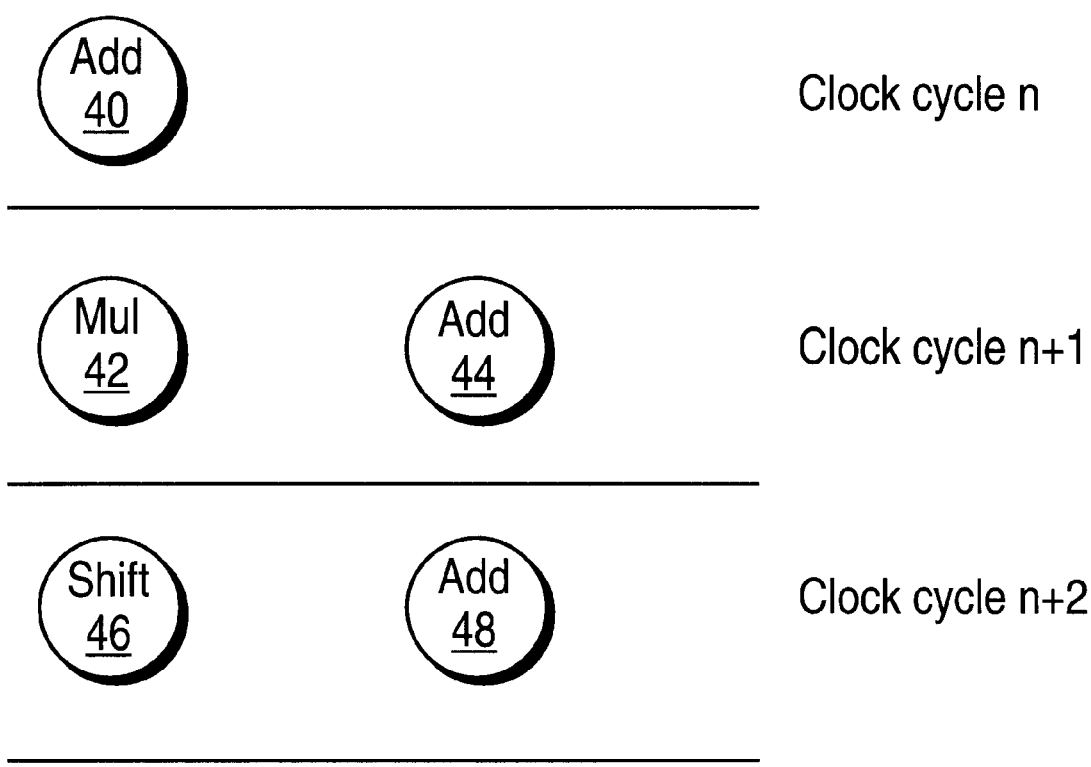
FIG. 4 shows an example scheduling of operations for a series of clock cycles.

FIG. 4 shows an example scheduling of operations generated at step 100 for a series of clock cycles (clock cycle n through clock cycle n+2). In this example, an add operation 40 is scheduled for clock cycle n, a multiply operation 42 and an add operation 44 are scheduled for clock cycle n+1, and a shift operation 46 and an add operation 48 are scheduled for clock cycle n+2.

In this example, the synthesizer 14 selects a 32-bit signed adder to perform the add operation 40 during clock cycle n according to the desired response specified in the behavioral description 10. The desired response requires 16-bit signed arithmetic for the add operation 44. Therefore, the 32-bit signed adder will also be used for the add operation 44 during clock cycle n+1 because an unsigned module cannot be used. The desired response does permit the use of 16-bit unsigned arithmetic for the add operation 48 so the synthesizer 14 selects a 16-bit unsigned adder for the add operation 48 for use during clock cycle n+2 so long as the 16-bit unsigned adder does not violate the design constraints 12 such as the limit on the overall gate count.

The power dissipation or power consumption of an available module is dependant on the inputs applied to the available module. In some embodiments, the module power characteristics 20 include the power dissipation characteristics for an available module for different input vectors that may be applied to the available module. The input vectors may be described in terms of signal and transition probability. The signal probability denotes the fraction of a time a signal is logic one and the transition probability is the number of transitions on any signal. The signal probability and the transition probability each may vary from zero to one.

The power characteristics for an available module may be obtained for all possible input vectors by generating different input vectors with different signal and transition probabilities and then obtaining the power dissipation for these input vectors. The different input vectors may be generated, for example, by sweeping the signal and transition probabilities from zero to one in steps of one-tenth.

The synthesizer 14 simulates the behavioral description 10 using typical vectors as seen by the system and the power dissipation is extracted from the known power values from previously obtained power characteristics. This may enhance the accuracy of the power characteristics for the design under real input conditions and may be used to guide module selection. This may enable more accurate trade-offs between the design constraints 12 and the power consumption of the circuit under design.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A method for designing a circuit, comprising the steps of:
   (a) if an existing signed module is not appropriate for a scheduled operation of the circuit, then selecting an unsigned module for performing the scheduled operation if permissible in view of a desired response of the circuit and selecting a signed module for performing the scheduled operation otherwise;
   (b) if the existing signed module is appropriate for the scheduled operation, then selecting the unsigned module for performing the scheduled operation if permissible in view of the desired response and if the unsigned module does not violate a set of design constraints for the circuit and using the existing signed module otherwise.

2. The method of claim 1, wherein step (a) comprises the steps of:
   determining whether the desired response requires signed arithmetic for the scheduled operation;
   if the desired response does not require signed arithmetic then selecting the unsigned module from among a set of available modules.

3. The method of claim 1, wherein step (b) comprises the steps of:
   determining whether the unsigned module if included in the circuit would exceed a limit on a gate count specified in the design constraints;
   if the limit would not be exceeded then selecting the unsigned module from among a set of available modules.

4. The method of claim 1, wherein step (a) comprises the step of selecting the unsigned module having a lowest power consumption.

5. The method of claim 1, wherein step (a) comprises the step of selecting the unsigned module having a lowest power consumption based on a set of input vectors that are to be applied to the unsigned module.

6. The method of claim 1, wherein step (a) comprises the step of selecting the signed module having a lowest power consumption.

7. The method of claim 6, wherein step (a) comprises the step of selecting the signed module having a lowest power consumption based on a set of input vectors that are to be applied to the signed module.

8. A system for designing a circuit, comprising:
   means for selecting an unsigned module for performing a scheduled operation in the circuit if permissible in view of a desired response of the circuit and if an existing signed module is not appropriate for the scheduled operation and for selecting a signed module for performing the scheduled operation otherwise;
   means for selecting the unsigned module for performing scheduled operation if permissible in view of the desired response and if the unsigned module does not violate a set of design constraints of the circuit if an existing signed module is appropriate for the scheduled operation, and using the existing signed module otherwise.

9. The system of claim 8, further comprising:
   means for determining whether the desired response requires signed arithmetic for the scheduled operation;
   means for selecting the unsigned module from among a set of available modules if the desired response does not require signed arithmetic.

10. The system of claim 8, further comprising:
    means for determining whether the unsigned module if included in the circuit would exceed a limit on a gate count specified in the design constraints;
    means for selecting the unsigned module from among a set of available modules if the limit would not be exceeded.

11. The system of claim 8, further comprises means for selecting the unsigned module having a lowest power consumption.

12. The system of claim 8, further comprises means for selecting the unsigned module having a lowest power consumption based on a set of input vectors that are to be applied to the unsigned module.

13. The system of claim 8, wherein the means for selecting a signed module comprises means for selecting the signed module having a lowest power consumption.

14. The system of claim 13, wherein the means for selecting a signed module comprises means for selecting the signed module having a lowest power consumption based on a set of input vectors that are to be applied to the signed module.

15. A system for designing a circuit, comprising:
    a behavioral description that specifies a desired response of the circuit;
    a set of design constraints for the circuit;
    a set of module power characteristics that specify a power consumption characteristic for each of a set of available modules;
    a synthesizer that generates an RTL description of the circuit in response to the behavioral description and the design constraints and the module power characteristics by selecting an unsigned module for performing a scheduled operation in the circuit if permissible in view of the desired response and if an existing signed module is not appropriate for the scheduled operation and selecting a signed module for performing the scheduled operation otherwise, and by selecting the unsigned module for performing the scheduled operation if permissible in view of the desired response and if the unsigned module does not violate the design constraints of the circuit if the existing signed module is appropriate for the scheduled operation and using the existing signed module otherwise.

16. The system of claim 15, wherein the synthesizer uses the module power characteristics to select the unsigned module having a lowest power consumption.

17. The system of claim 15, wherein the synthesizer uses the module power characteristics to select the signed module having a lowest power consumption.

18. A system for designing a circuit, comprising:
- a behavioral description that specifies a desired response of the circuit;
- a set of design constraints for the circuit;
- a set of module power characteristics that specify a power consumption characteristic for each of a set of available modules;
- a synthesizer that generates an RTL description of the circuit in response to the behavioral description and the design constraints and the module power characteristics by selecting a set of modules from among the available modules for performing a set of scheduled operations of the circuit using unsigned modules in view of the desired response and using unsigned modules for low power consumption of the circuit in view of the design constraints wherein the power consumption characteristic for an available module includes a power consumption for each of a set of input vectors to the available module.

19. The system of claim 18, wherein the synthesizer selects modules based on the input vectors.

* * * * *